United States Patent [19]

Firdaus

[11] 4,033,173
[45] July 5, 1977

[54] METHOD AND SYSTEM FOR SENSING AN IDENTIFYING MEANS

[75] Inventor: Asad Firdaus, Wappinger Falls, N.Y.

[73] Assignee: International Business Machines Corporation, Armonk, N.Y.

[22] Filed: Feb. 11, 1976

[21] Appl. No.: 657,126

Related U.S. Application Data

[62] Division of Ser. No. 535,263, Dec. 23, 1974, Pat. No. 3,962,903.

[52] U.S. Cl. .................................. 73/37
[51] Int. Cl.² ........................... G01B 13/00
[58] Field of Search .......... 73/37, 37.5, 37.7, 37.6, 73/37.9, 37.8, 432 R, 104, 105; 137/83

[56] References Cited
FOREIGN PATENTS OR APPLICATIONS

| | | |
|---|---|---|
| 1,166,178 | 10/1969 | United Kingdom ............... 73/37.5 |
| 1,358,524 | 7/1974 | United Kingdom ............... 73/37.5 |

*Primary Examiner*—Donald O. Woodiel
*Attorney, Agent, or Firm*—George O. Saile

[57] ABSTRACT

A metallized ceramic substrate has a slot provided in one quadrant on one side thereof. The substrate is disposed in receiving means having either two or four restrictive openings therein and over which the substrate is disposed. Fluid pressure is supplied from a pressure source in a separate path to each of these openings. The opening, which has the slot disposed thereover, has a different pressure in its path from the pressure source than the other openings so that the location of the slot, if it is in the surface of the substrate disposed next to the openings, can be ascertained.

17 Claims, 5 Drawing Figures

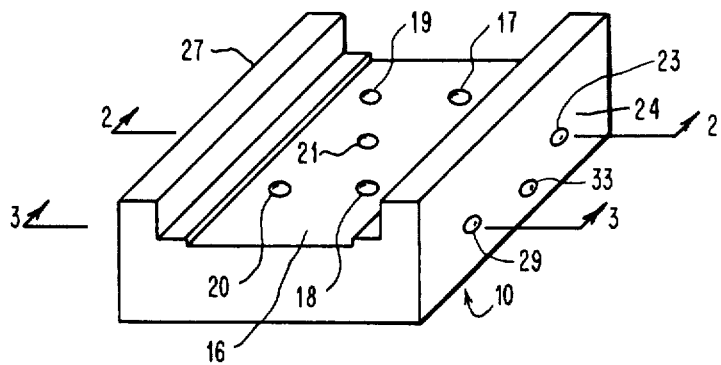
FIG. 1
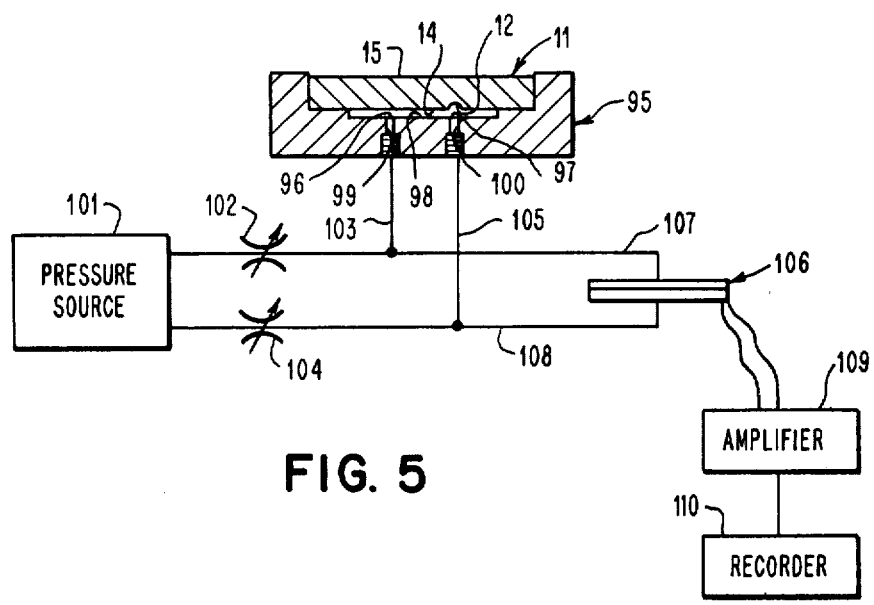
FIG. 2
FIG. 3
FIG. 5

METHOD AND SYSTEM FOR SENSING AN IDENTIFYING MEANS

This is a division of application Ser. No. 535,263, filed Dec. 23, 1974, now U.S. Pat. No. 3,962,903.

In processing a metallized ceramic substrate, it is desired to deposit metal on a specific surface such as one that has been mechanically ground, for example. After the metal is deposited, it is desired that circuits be formed in certain areas of the substrate.

Therefore, before depositing metal on this surface during processing, it is necessary to insure that the substrate is properly oriented as to both the specific surface being disposed for having metal deposited thereon and the area in which a circuit is to be formed through etching the metal, for example. Since the substrates move at a relatively rapid rate, it is necessary that this identification of the orientation of the substrate be accomplished in a very short period of time such as less than one-quarter of a second, for example.

If the substrate is not properly oriented, then suitable mechanism is employed to correctly orient the substrate after it has been determined that it is not properly oriented for the metallizing step. Because the metallization is deposited on the mechanically ground surface, for example, it is desired that this mechanically ground surface not be contacted by any type of orientation system. Thus, it is necessary that the sensing occur without contact with the substrate surfaces.

The present invention satisfactorily solves the foregoing problem through providing a method and system for detecting the orientation of the substrate without contact therewith. Thus, if the substrate should be inadvertently oriented so that the mechanically ground surface is the surface disposed for identification purposes, the lack of contact therewith prevents any damage thereto.

The present invention relies upon a slot or the like being formed in the surface of the substrate opposite to that having the mechanically ground surface on which metallization is to occur. Through the use of a pressurized fluid being supplied to restrictive openings in a receiving area in which the substrate is disposed momentarily, the location of the slot, if it is in the surface, can be ascertained. If the slot is not in the surface next to the openings, then a signal is produced to indicate that the substrate must be turned upside down so that the ground surface on which metallization is to occur will be properly oriented.

When the slot is in the surface next to the openings, the ascertaining of the location of the slot in one of the quadrants of the surface is employed to indicate the orientation of the substrate. If the slot is not in the correct quadrant, then suitable mechanism, which is responsive to a signal indicating that the slot is not in the correct quadrant, is utilized to change the orientation of the substrate.

An object of this invention is to provide a fluidic system for detecting the orientation of an element.

Another object of this invention is to provide a fluidic system for detecting the presence or absence of an identifying means on an element.

A further object of this invention is to provide a method for detecting the orientation of an element.

Still another object of this invention is to provide a method for detecting the presence or absence of an identifying means on an element.

The foregoing and other objects, features, and advantages of the invention will be apparent from the following more particular description of preferred embodiments of the invention, as illustrated in the accompanying drawings.

In the drawings:

FIG. 1 is a perspective view of a receiving member in which an element to be sensed is received.

FIG. 2 is a sectional view of the receiving member of FIG. 1 and taken along line 2—2 of FIG. 1.

FIG. 3 is a sectional view of the receiving member of FIG. 1 and taken along line 3—3 of FIG. 1.

FIG. 5 is a schematic view, partly in section, of another form of sensing system of the present invention.

Figure 4:
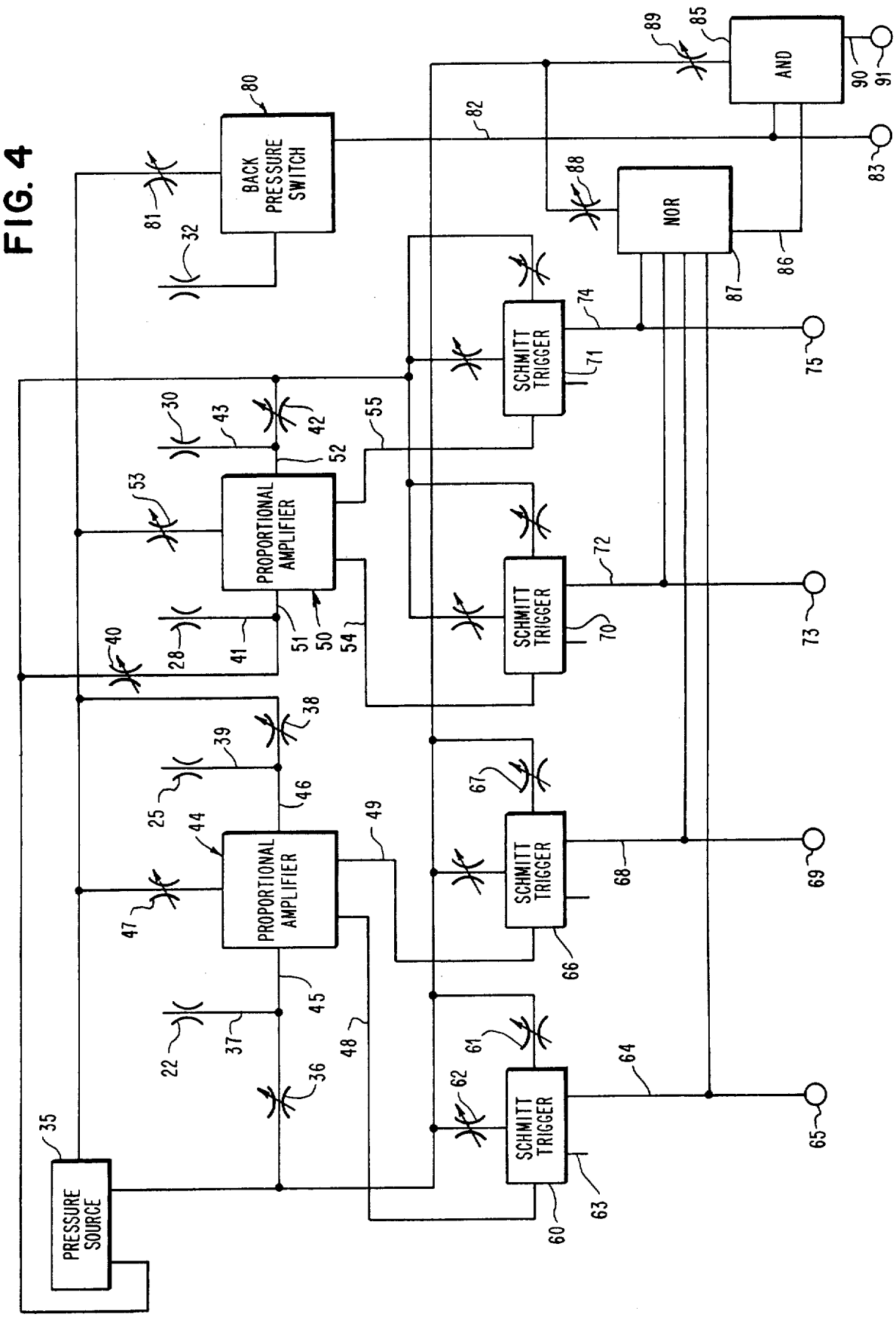
FIG. 4 is a schematic diagram of a system for sensing the orientation of the element in the receiving member of FIG. 1.

Referring to the drawings and particularly FIG. 1, there is shown a receiving member 10, which forms a station at which the orientation of an element such as a substrate 11, for example, can be determined when the substrate 11 is supported within the receiving member 10 as shown in FIGS. 2 and 3.

The substrate 11 has a slot 12 (see FIG. 2) formed in one portion of a surface 14 of the substrate 11. The substrate 11, which can be a metallized ceramic substrate, for example, has a surface 15, which is mechanically ground when the substrate 11 is a metallized ceramic substrate, parallel to the surface 14. When the substrate 11 enters the receiving member 10 with the surface 15 properly oriented to have metal deposited thereon, the surface 15 will be above the surface 14 as shown in FIG. 2.

The receiving member 10 has its surface 16 (see FIG. 1) formed with restrictive openings 17, 18, 19, and 20 disposed in four quadrants of the surface 16. The surface 16 has a fifth restrictive opening 21, which is formed in the center thereof between the openings 17-20. Each of the openings 17-21 is smaller than the slot 12 in the substrate 11.

As shown in FIG. 2, the opening 17 communicates with a passage 22, which is the same diameter as the opening 17, in the receiving member 10. The passage 22 communicates with an opening 23 in a side wall 24 of the receiving member 10.

The opening 19 communicates with a passage 25, which is the same diameter as the opening 19, in the receiving member 10. The passage 25 communicates with an opening 26 in a side wall 27, which is parallel to the side wall 24, of the receiving member 10.

As shown in FIG. 3, the opening 18 communicates through a passage 28, which is the same diameter as the opening 18, in the receiving member 10 with an opening 29 in the wall 24. The opening 20 communicates through a passage 30, which is the same diameter as the opening 20, in the receiving member 10 with an opening 31 in the wall 27. The opening 21 communicates through a passage 32, which is the same diameter as the opening 21, in the receiving member 10 with an opening 33 in the wall 24. Accordingly, each of the openings 17-21 has communication through the receiving member 10 with the exterior thereof.

A pressurized fluid such as air, for example, is supplied to the openings 23, 26, 29, and 31 so that each of the passages 22, 25, 28, and 30 has pressurized air supplied thereto. The pressurized air is preferably supplied from a common fluid pressure source 35 (see FIG. 4) along separate paths to each of the openings 23, 26, 29, and 31.

As shown in FIG. 4, the fluid pressure source 35 is connected through a pressure reducer 36, which is preferably a needle valve, by a tubing 37 to the passage 22, through a pressure reducer 38, which is preferably a needle valve, by a tubing 39 to the passage 25, through a pressure reducer 40, which is preferably a needle valve, by a tubing 41 to the passage 28, and through a pressure reducer 42, which is preferably a needle valve, by a tubing 43 to the passage 30. The pressure reducers 36, 38, 40, and 42 are utilized to insure that the pressure in each of the paths to each of the passages 22, 25, 28, and 30 is the same when the passages are vented to the atmosphere through the connecting restrictive openings 17-20 in the surface 16 of the receiving member 10. The tubings or lines 37, 39, 41, and 43 are larger than the openings 17, 19, 18, and 20, respectively, so that the openings 17-20 are restrictive.

A proportional amplifier 44 has an input connected to the tubing 37 between the pressure reducer 36 and the passage 22 by a line 45 and another input connected by a line 46 to the tubing 39 between the pressure reducer 38 and the passage 25. The fluid pressure source 35 is connected to the proportional amplifier 44 through a pressure reducer 47, which is preferably a needle valve, to provide a pressure source for the proportional amplifier 44. The proportional amplifier 44 has the pressure in its output lines 48 and 49 dependent on the pressures in the input lines 45 and 46.

A proportional amplifier 50 has its input line 51 connected to the tubing 41 between the pressure reducer 40 and the passage 28 and its input line 52 connected to the tubing 43 between the passage 30 amd the pressure reducer 42. The fluid pressure source 35 is connected to the proportional amplifier 50 through a pressure reducer 53, which is preferably a needle valve, to provide a pressure source for the proportional amplifier 50. The proportional amplifier 50 has the pressures in its output lines 54 and 55 dependent on the pressures in the input lines 51 and 52.

The input pressure supplied to each of the proportional amplifiers 44 and 50 is less than the pressure of the pressure source 35. For example, the pressure source 35 could supply an output pressure of 15 p.s.i. while the input pressure to each of the proportional amplifiers 44 and 50 would be 10 p.s.i. The pressure at the output of each of the pressure reducers 36, 38, 40, and 42 is about 1 p.s.i. and must be less than the input pressure supplied to each of the proportional amplifiers 44 and 50.

The output line 48 of the proportional amplifier 44 is connected to a fluidic Schmitt trigger 60. The Schmitt trigger 60 has both a reference pressure supplied from the pressure source 35 through a pressure reducer 61 and a supply pressure from the pressure source 35 through a pressure reducer 62. The reference pressure from the pressure reducer 61, which is preferably a needle valve, is less than the supply pressure from the pressure reducer 62, which is preferably a needle valve. The supply pressure is preferably the same as the pressure supplied to each of the proportional amplifiers 44 and 50.

The reference pressure from the pressure reducer 61 is greater than the pressure in the line 48 unless the pressure in the line 48 is increased because of a decrease in the input line 46 relative to the pressure in the input line 45. This would occur when the slot 12 in the substrate 11 is disposed over the opening 19 so that less resistance is offered to the flow through the opening 19 than through the opening 17.

When the reference pressure from the pressure reducer 61 is greater than the pressure in the input line 48 to the Schmitt trigger 60, the fluid flows from the line 48 through the Schmitt trigger 60 and exhausts to the atmosphere through an exhaust line 63. However, if the pressure in the line 48 exceeds the reference pressure from the pressure reducer 61, then the Schmitt trigger 60 changes the connection of the line 48 from the exhaust line 63 to output line 64 of the Schmitt trigger 60.

The line 64 is connected to an indicator 65, such as a lamp, for example, to energize the lamp when there is fluid pressure in the line 64. This indicates that the slot 12 in the substrate 11 is disposed over the opening 19 in the surface 16 of the receiving member 10. Therefore, the orientation of the substrate 11 is known through the indicator 65 being activated. Of course, the signal from the line 64 also can be supplied to a device for comparing this location of the slot 12 with that desired for the correct orientation of the substrate 11.

The output line 49 of the proportional amplifier 44 is connected to a Schmitt trigger 66, which functions in the same manner as the Schmitt trigger 60. The pressure in the line 49 becomes greater than the reference pressure from a pressure reducer 67, which is connected to the Schmitt trigger 66 and to the pressure source 35 and is preferably a needle valve, only when the slot 12 in the substrate 11 is disposed over the opening 17 as shown in FIG. 2. When this occurs, the pressure in the output line 49 of the proportional amplifier 44 is supplied to output line 68 of the Schmitt trigger 66. The pressure is supplied through the output line 68 to an indicator 69 such as a lamp, for example, to indicate that the slot 12 in the substrate 11 is disposed over the opening 17.

The proportional amplifier 50 has the output line 54 connected to a Schmitt trigger 70 and the output line 55 connected to a Schmitt trigger 71. The Schmitt trigger 70 supplies pressure from the output line 54 of the proportional amplifier 50 to output line 72 of the Schmitt trigger 70 only when the pressure in the input line 52 becomes less than that in the input line 51 of the proportional amplifier 50. This occurs when the slot 12 in the substrate 11 is disposed over the opening 20. The fluid pressure in the output line 72 of the Schmitt trigger 70 causes an indicator 73 such as a lamp, for example, to be energized to indicate the location of the slot 12 in the substrate 11.

When the pressure in the input line 51 of the proportional amplifier 50 is less than that in the input line 52 of the proportional amplifier 50, the slot 12 in the substrate 11 is disposed over the opening 18 in the surface 16 of the receiving member 10. This results in the pressure in the output line 55 of the proportional amplifier 50 being supplied through the Schmitt trigger 71 to its output line 74. The output line 74 of the Schmitt trigger 71 is connected to an indicator 75 such as a lamp, for example, to indicate the location of the slot 12 in the substrate 11 with respect to the receiving member 10 so as to disclose the orientation of the substrate 11.

It should be understood that each of the Schmitt triggers 66, 70, and 71 is connected to the pressure source 35 through a pressure reducer in the same manner as the Schmitt trigger 60 is connected by the pressure reducer 62 to the pressure source 35. This provides the supply pressure for each of the Schmitt triggers 66, 70, and 71. It also should be understood that each of the Schmitt triggers 70 and 71 is connected through a pressure reducer to the pressure source 35 so as to have a reference pressuere for each of the Schmitt triggers 70 and 71 in the same manner as described for each of the Schmitt triggers 60 and 66. The relationship of the reference pressure to the supply pressure and the pressure in the input line to each of the Schmitt triggers 66, 70, and 71 is the same as previously described for the Schmitt trigger 60.

The passage 32, which communicates between the opening 21 and the opening 33, is connected with a fluidic back pressure switch 80, which has the pressure source 35 connected thereto through a pressure reducer 81. The pressure from the pressure reducer 81, which is preferably a needle valve, is preferably the same as the pressure supplied from the pressure source 35 to the proportional amplifier 44 from the pressure reducer 47.

When the substrate 11 is disposed in the receiving member 10 to block the opening 21, the back pressure switch 80 closes so that pressure from the pressure reducer 81 is supplied through then closed back pressure switch 80 to its output line 82. An indicator 83 such as a lamp, for example, is energized when the output line 82 has pressure therein. Accordingly, the indicator 82 indicates when the substrate 11 is in the receiving member 10.

The output line 82 of the back pressure switch 80 also is connected as one input to a fluidic AND gate 85. The AND gate 85 has an output line 86 of a fluidic NOR gate 87 connected thereto as a second input.

The NOR gate 87 has the output line 64 of the Schmitt trigger 60, the output line 69 of the Schmitt trigger 66, the output line 72 of the Schmitt trigger 70, and the output line 74 of the Schmitt trigger 71 as inputs. The pressure source 35 also is connected through a pressure reducer 88, which is preferably a needle valve, to the NOR gate 87.

As long as there is no output pressure on any of the output lines 64, 68, 72, and 74 of the Schmitt triggers 60, 66, 70, and 71, respectively, then the output line 86 of the NOR gate 87 transmits the pressure from the pressure reducer 88 to the AND gate 85. However, if any of the output lines 64, 68, 72, and 74 of the Schmitt triggers 60, 66, 70, and 71, respectively, has pressure therein, then the pressure in the output line 86 of the NOR gate 87 falls.

The AND gate 85 has the pressure source 35 connected thereto through a pressure reducer 89, which is preferably a needle valve. The supply pressure from the pressure reducer 89 is transmitted to an output line 90 of the AND gate 85 whenever there is pressure in the output line 82 of the back pressure switch 80 and in the output line 86 of the NOR gate 87. This occurs only when the substrate 11 is in the receiving member 10 and the slot 12 is not disposed over any of the openings 17–20. This occurs only when the surface 15 of the substrate 11 is disposed adjacent the surface 16 of the receiving member 10 rather than the surface 14.

The output line 90 of the AND gate 85 is connected to an indicator 91 such as a lamp, for example. Thus, when there is pressure in the output line 90 to indicate that the slot 12 is not disposed over any of the openings 17—20 even though the substrate 11 is in the receiving member 10, the indicator 91 is energized to indicate this.

It should be understood that the pressure from the pressure reducer 81 to the back pressure switch 80, from the pressure reducer 88 to the NOR gate 87, and from the pressure reducer 89 to the AND gate 85 is preferably the same. These pressures also are preferably the same as the pressure supplied from the pressure reducer 47 to the proportional amplifier 44. It should be understood that all of the pressure reducers require a pressure gauge (not shown) to insure that the desired pressure is supplied from each of the pressure reducers.

Considering the operation of the present invention, the substrate 11 is stopped by suitable means (not shown) during its movement so that it is disposed within the receiving member 10 in a position such that the slot 12 will be disposed over one of the receiving members 10 of the openings 17–20 if the surface 14 is adjacent the surface 16. If the substrate 11 does not have the surface 14 disposed adjacent the surface 16 of the receiving member 10, then the indicators 83 and 91 are activated to indicate this. However, if the surface 14 of the substrate 11 is disposed next to the surface 16 of the receiving member 10, then the slot 12 is disposed over one of the openings 17-20, and this is indicated by one of the indicators 65, 69, 73, and 75 being activated. Of course, the indicator 83 also is energized to show that the substrate 11 is in the receiving member 10.

Referring to FIG. 5, there is shown another form of the invention in which a receiving member 95 receives the substrate 11. In this arrangement, there are only two restrictive openings 96 and 97 in a surface 98 of the receiving member 95. Thus, with this embodiment, it can only be determined as to which side of the substrate 11 has the slot 12.

The opening 96 communicates with a passage 99 in the receiving member 95. The opening 97 communicates with a passage 100 in the receiving member 95.

A common fluid pressure source 101 is connected through a pressure reducer 102, which is preferably a needle valve, and a tubing or line 103 to the passage 99 and through a pressure reducer 104, which is preferably a needle valve, and a tubing or line 105 to the passage 100. A transducer 106, such as a piezoelectric transducer, for example, has a line 107 connected to the line 103 between the pressure reducer 102 and the passage 99 and a line 108 connected to the line 105 between the pressure reducer 104 and the passage 100.

As long as the pressures in the two lines 107 and 108 are the same, the transducer 106 produces a constant output signal to an amplifier 109. If the slot 12 is disposed over the opening 97 as shown in FIG. 5, then the transducer 106 increases its output signal to the amplifier 109. If the slot 12 is disposed over the opening 96, the output signal from the transducer 106 to the amplifier 109 decreases. A recoder 110 can be employed to indicate the location of the slot 12 in the substrate 11.

The fluidic circuit of FIG. 5 is the equivalent of an electric Wheatstone bridge in that the pressure reducers 102 and 104 form two legs of an equivalent Wheatstone bridge with the pressure source 101 connected at one end of each of the pressure reducers 102 and 104 and the transducer 106 disposed at the other ends of the pressure reducers 102 and 104. The third leg of the equivalent Wheatstone bridge is provided by the restrictive opening 96 and its passage 99 with the fourth leg of the equivalent Wheatstone bridge being formed by the restrictive opening 97 and its passage 100. Since the openings 96 and 97 communicate with the atmosphere, they are considered to be joined to each other to form the connection of the third and fourth legs.

The size of the slot 12 in the substrate 11, the diameter of the restrictive openings 17–21 of FIG. 1 or 96 and 97 of FIG. 5, and the gap between the substrate 11 and the restrictive openings 17–21 in the receiving member 10 of FIG. 1 or the restrictive openings 96 and 97 in the receiving member 95 of FIG. 5 are interrelated to each other. The slot 12 must be larger than the restrictive openings, and the size of the restrictive openings is determined by the gap between them and the adjacent surface of the substrate 11.

While the present invention has shown and described the slot 12 as being utilized for sensing the orientation of the substrate 11, it should be understood that the location of the slot 12 could be utilized in other environments. For example, if numbers were coded into the form of slots, then the location of each of the slots could be utilized to ascertain the serial numer or part number of a device without contact therewith.

An advantage of this invention is that there is no contact with the element being sensed by the system. Another advantage of this invention is its rapid sense of the orientation of each element. A further advantage of this invention is that it is self cleaning in that the positive pressure prevents any blocking of any passages or openings.

While the invention has been particularly shown and described with reference to preferred embodiments thereof, it will be understood by those skilled in the art that various changes in form and details may be made therein without departing from the spirit and scope of the invention.

What is claimed is:

1. A system for detecting the orientation of a semiconductor substrate having a metallic surface and a surface substantially parallel thereto with the substantially parallel surface having identifying means therein including:
   receiving means to receive the semiconductor substrate in a temporary stationary position without damage to the metallized surface if the semiconductor substrate is disposed so that the metallized surface is in the position in which the parallel surface is to be disposed for detecting the orientation of the semiconductor substrate;
   first means to indicate if the semiconductor substrate is disposed in said receiving means so that the metallized surface is not engaging said receiving means;
   means to sense the location of the identifying means without contact with the surface of the semiconductor substrate;
   and a second means to indicate the orientation of the semiconductor substrate by the location of the identifying means relative to said receiving means.

2. The system according to claim 1 in which the identifying means in the substantially parallel surface of the semiconductor substrate is a slot that does not extend through the semiconductor substrate.

3. The system according to claim 2 in which:
   said sensing means includes:
      a plurality of spaced restrictive openings in said receiving means, said spaced restrictive openings having spaced portions of the semiconductor substrate disposed adjacent thereto but spaced therefrom when the semiconductor substrate is disposed in said receiving means;
      means to supply fluid at the same predetermined pressure along a separate path to each of said openings;
      and means to determine the fluid pressure in each of the paths;
   and said second means indicates the orientation of the semiconductor substrate in accordance with the fluid pressures determined by said determining means.

4. The system according to claim 3 including:
   fluid pressure supply means connected to each of said openings;
   and means to reduce the fluid pressure in each of the paths the same amount between said fluid pressure supply means and said openings.

5. The system according to claim 4 in which said first means includes fluid pressure means.

6. The system according to claim 5 in which each of said restrictive openings is smaller than the slot in the semiconductor substrate.

7. The system according to claim 3 in which:
   said plurality of spaced restrictive openings comprises an even number, said receiving means has at least two of said spaced restrictive openings;
   and said determining means includes means to sense the fluid pressure in each of the paths of each pair of said spaced restrictive openings to determine which, if either, of the paths of each pair of said spaced restrictive openings has the fluid pressure therein changed to ascertain the location of the slot in the semiconductor substrate.

8. The system according to claim 7 in which said receiving means has only two of said spaced restrictive openings.

9. The system according to claim 7 in which:
   said receiving means has four of said spaced restrictive openings;
   and said determining means has separate sensing means for each of the two pairs of paths of said spaced restrictive openings.

10. The system according to claim 1 in which:
   said sensing means includes:
      a plurality of spaced restrictive openings in said receiving means, said spaced restrictive openings having spaced portions of the semiconductor substrate disposed adjacent thereto but spaced therefrom when the semiconductor substrate is disposed in said receiving means;
      means to supply fluid at the same predetermined pressure along a separate path to each of said openings;
      and means to determine the fluid pressure in each of the paths;
   and said second means indicates the orientation of the semiconductor substrate in accordance with the fluid pressures determined by said determining means.

11. The system according to claim 10 including:
   fluid pressure supply means connected to each of said openings;
   and means to reduce the fluid pressure in each of the paths the same amount between said fluid pressure supply means and said openings.

12. The system according to claim 11 in which said first means includes fluid pressure means.

13. A method for determining the orientation of an element having an identifying means in a surface thereof without contacting the surface including:

disposing a surface of the element in spaced relation and adjacent to each of an even number of fluid paths so that the identifying means is aligned with only one of the fluid paths if the surface having the identifying means is adjacent to the fluid paths;

retaining the element in this position while ascertaining the pressure in each of the fluid paths;

and comparing the fluid pressure in each of the fluid paths of each pair of the fluid paths to determine which, if either, of the paths of each pair has the fluid pressure therein changed to detect the orientation of the element in accordance with the location of the identifying means relative to the fluid paths if the surface having the identifying means is adjacent to the fluid paths.

14. The method according to claim 13 in which each of the plurality of fluid paths has a restrictive opening disposed adjacent to the surface of the element but spaced therefrom.

15. The method according to claim 14 including:

supplying the fluid to each of the paths from a common fluid pressure source;

reducing the pressure from the common fluid pressure source the same amount in each of the paths;

and determining the pressure in each of the paths after the pressure is reduced and before the opening for determination of the pressure in each of the paths.

16. The method according to claim 15 including indicating which, if any, of the openings has the identifying means disposed adjacent thereto in accordance with the fluid pressure in each of the paths.

17. The method according to claim 16 in which the identifying means in the surface of the element is a slot that does not extend through the element.

* * * * *